United States Patent [19]

Rijckaert

[11] 4,259,605
[45] Mar. 31, 1981

[54] CIRCUIT FOR CONTROLLING A PIEZO-ELECTRIC POSITIONING ELEMENT

[75] Inventor: Albert M. A. Rijckaert, Eindhoven, Netherlands

[73] Assignee: U.S. Philips Corporation, New York, N.Y.

[21] Appl. No.: 41,021

[22] Filed: May 21, 1979

[30] Foreign Application Priority Data

May 29, 1978 [NL] Netherlands ............... 7805802

[51] Int. Cl.³ .............................................. H01L 41/08
[52] U.S. Cl. ..................................... 310/317; 310/326
[58] Field of Search ............... 310/314, 316, 317, 330, 310/332, 326

[56] References Cited

U.S. PATENT DOCUMENTS

| 2,651,012 | 9/1953 | Valkenburg et al. | 310/317 X |
| 3,296,467 | 1/1967 | Locher | 310/317 |
| 3,409,787 | 11/1968 | Agalides et al. | 310/316 |
| 3,532,911 | 10/1970 | Roberts et al. | 310/317 X |
| 3,821,747 | 6/1974 | Mason | 310/332 X |
| 4,106,065 | 8/1978 | Ravizza | 310/330 X |

Primary Examiner—Mark O. Budd
Attorney, Agent, or Firm—Thomas A. Briody; William J. Streeter; Algy Tamoshunas

[57] ABSTRACT

A device for controlling a piezo-electric positioning element. In order to ensure that said element occupies a well-defined rest position, the device comprises a circuit for generating an electrical oscillation whose amplitude decreases to zero as a function of time and which varies symmetrically about a reference value, and for applying said oscillation to the piezo-electric element, so that hysteresis effects are eliminated.

10 Claims, 9 Drawing Figures

CIRCUIT FOR CONTROLLING A PIEZO-ELECTRIC POSITIONING ELEMENT

The invention relates to a device for controlling a piezo-electric positioning element, in particular for positioning a recording and/or reproducing element relative to an information track.

Piezo-electric positioning elements are, for example, used in recorders (for example magnetic and optical recorders with record carriers in the form of a tape or disk) for positioning a recording and/or reproducing element. Situations may then occur in which it is desirable that the piezo-element occupies a well-defined rest position, for example when the piezo-element positions a combined recording and reproducing element under command of a control signal which is derived from the reproduced signal. A system in which this is the case is described in patent application Ser. No. 041,673, filed May 23, 1979 and assigned to the assignee of the present application. In this system the position of the recording and reproducing element is not controlled during recording and this recording and reproducing element should occupy a well-defined rest position.

When the voltage across the piezo-electric element is brought to a reference value in order to cause the element to assume a rest position, this rest position is not correctly defined as a result of hysteresis effects and inter alia depends on the magnitude and polarity of the voltage which appeared across the piezo-electric element in order to bring said voltage to the reference value, and on the position then occupied by the piezo-electric element.

It is the object of the invention to provide a device of the type mentioned in the preamble with which a well-defined rest position is obtained.

The invention is characterized by a circuit arrangement for generating an electrical oscillation whose amplitude decreases to zero as a function of time and the application of this oscillation to the piezo-electric element in such a way that upon termination of the oscillation the voltage across the piezo-electric element assumes a defined reference value, the oscillation varying symmetrically about the reference value.

As the voltage across the piezo-electric element is brought the reference value in an oscillating manner, the effect of hysteresis on the ultimate rest position of the piezo-electric element is eliminated.

An embodiment of a device in accordance with the invention is characterized in that the circuit arrangement comprises a resonant circuit, which includes the piezo-electric element as the capacitance, and that there are provided first means for causing the supply voltage for the circuit arrangement to decrease as a function of time, so as to cause the amplitude of the oscillation to decrease as a function of time.

In respect of the resonant circuit this embodiment may further be characterized in that the resonant circuit comprises a transformer with a primary and secondary winding, the piezo-electric element being connected in parallel with the secondary winding via first switching means, and that there are provided first means for closing the first switching means prior to the beginning of the electrical oscillation.

In order to obtain an oscillation in the resonant circuit in a simple manner, this embodiment is further characterized in that the primary winding comprises a center tap which is connected to a first power supply terminal via a first connection. One end of the primary winding is connected to the collector of a first transistor and its other end is connected to the collector of a second transistor. The emitter electrodes of the first and the second transistor are connected to a second power-supply terminal via a second connection. The base electrode of the first transistor is connected to the collector of the second transistor in a degenerative sense and the base electrode of the second transistor is connected to the collector electrode of the first transistor in a degenerative sense, second means being provided for starting the electrical oscillation.

The first and the second transistor together with the resonant circuit comprising the transformer and the capacitance of the piezoelectric element may then operate as a multivibrator.

The first and the second transistor may also be used as switches for transferring current pulses from and to the piezoelectric element via the transformer as described in patent application Ser. No. 041,022, filed May 21, 1979 and assigned to the assignee of the present application. In order to enable the embodiment of the invention to be used both in accordance with application Serial No. 041,022 and with the present invention, such an embodiment is characterized in that the base electrodes of the first and second transistor are connected to a first and second control input, respectively. The aforementioned first and second means are constituted by a second circuit having outputs which are connected to the first and the second control input, the second circuit being switchable in a way such that the outputs can assume a first state in which the outputs have a comparatively low output impedance and can transfer control voltages to the base electrodes of the first and the second transistor, and a second state in which said outputs have a comparatively high output impedance and are consequently floating, so that crosswise negative feedback becomes active between the bases and collectors of the first and the second transistor and the electrical oscillation is generated.

In order to cause the supply voltage for the multivibrator to decrease as a function of time an embodiment is characterized in that the first means comprise a switch which is included in either the first or the second connection, and a buffer capacitor, which is included between that side of said switch which is remote from the associated power supply terminal and the other connection, which switch is open during the generation of said oscillation.

When the switch is opened, the multivibrator is energized from the buffer capacitor, so that the supply voltage for the multivibrator decreases as a function of time.

In order to cause the switch to be also actuated by the second circuit the switch may advantageously include a third transistor whose collector is connected to the buffer capacitor, whose emitter is connected to the power supply terminal associated with the switch, and whose base is connected to the emitter via an impedance and to an output of the second circuit, which output is at such a voltage in the first state that the transistor is conductive.

Preferably the first switching means comprises a fourth transistor of a first conductivity type and a fifth transistor of a second conductivity type. The emitter of the fourth and fifth transistor are connected to a point at a fixed voltage and the collector-emitter paths are connected in parallel with the series connection of the secondary winding and the piezo-electric element. The base electrode of the fourth and the fifth transistor are connected to outputs of the second circuit and, via impedances, to points at a voltage such that when the outputs of said second circuit are in the second state the fourth and the fifth transistor are conductive.

In order to enable the switch to be activated also after the outputs have assumed the second state, it is advantageous that the device comprises a switch with one side connected to the base of the third transistor via an RC-network and to the emitter of the third transistor via a resistor and with the other side to a point of fixed voltage, in such a way that when said switch is closed the third transistor becomes conductive for a specific time.

The invention will now be described in more detail with reference to the drawings wherein.

Figure 3:
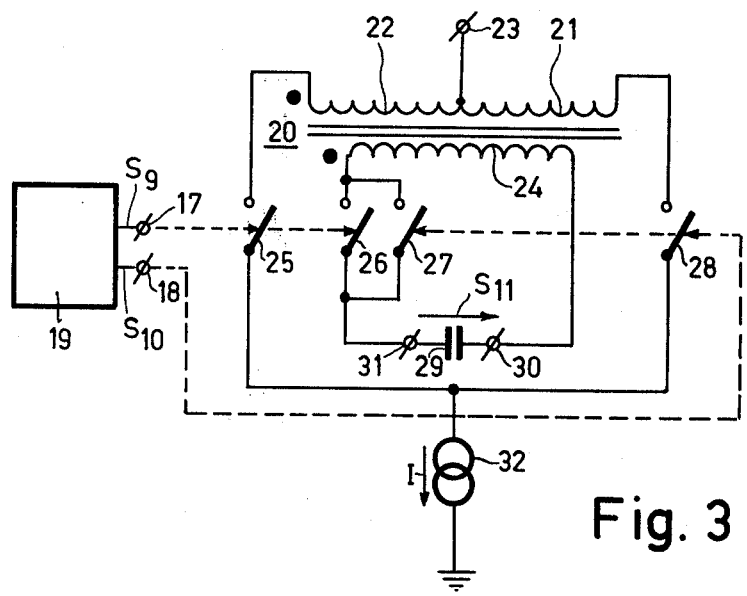
FIG. 3 shows the circuit diagram of a device for the application of a control voltage across a piezo-electric element.
Figure 5:
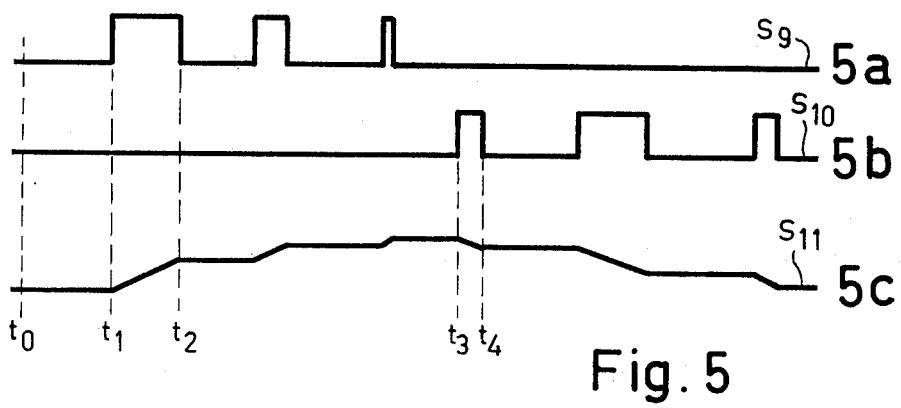
Figure 6:
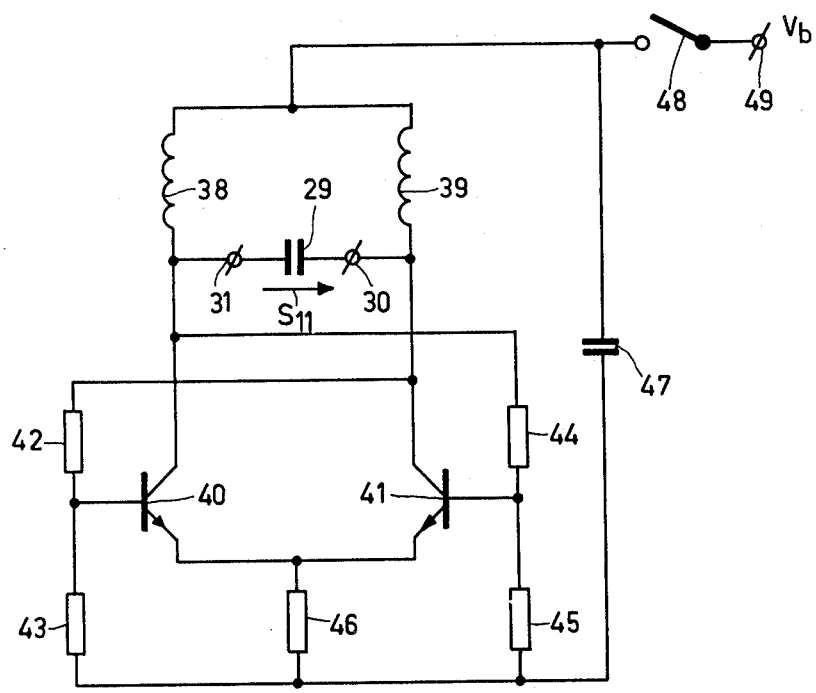
Figure 7:
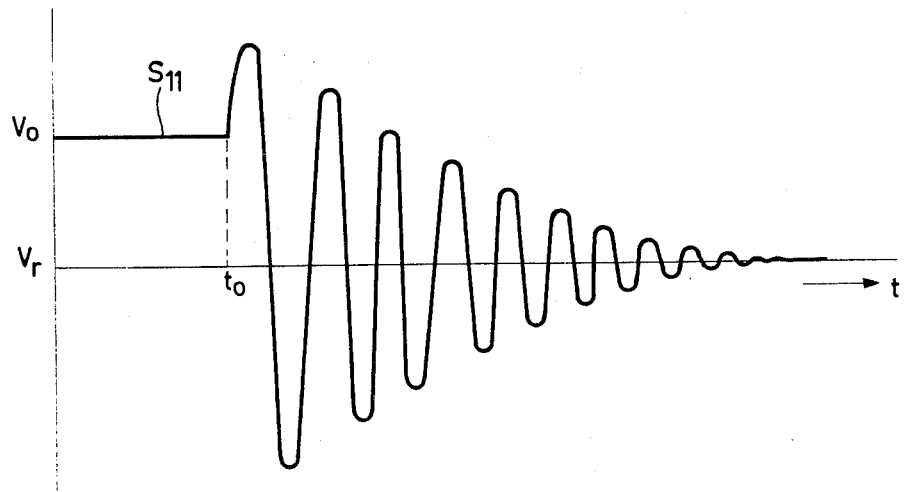
Figure 8:
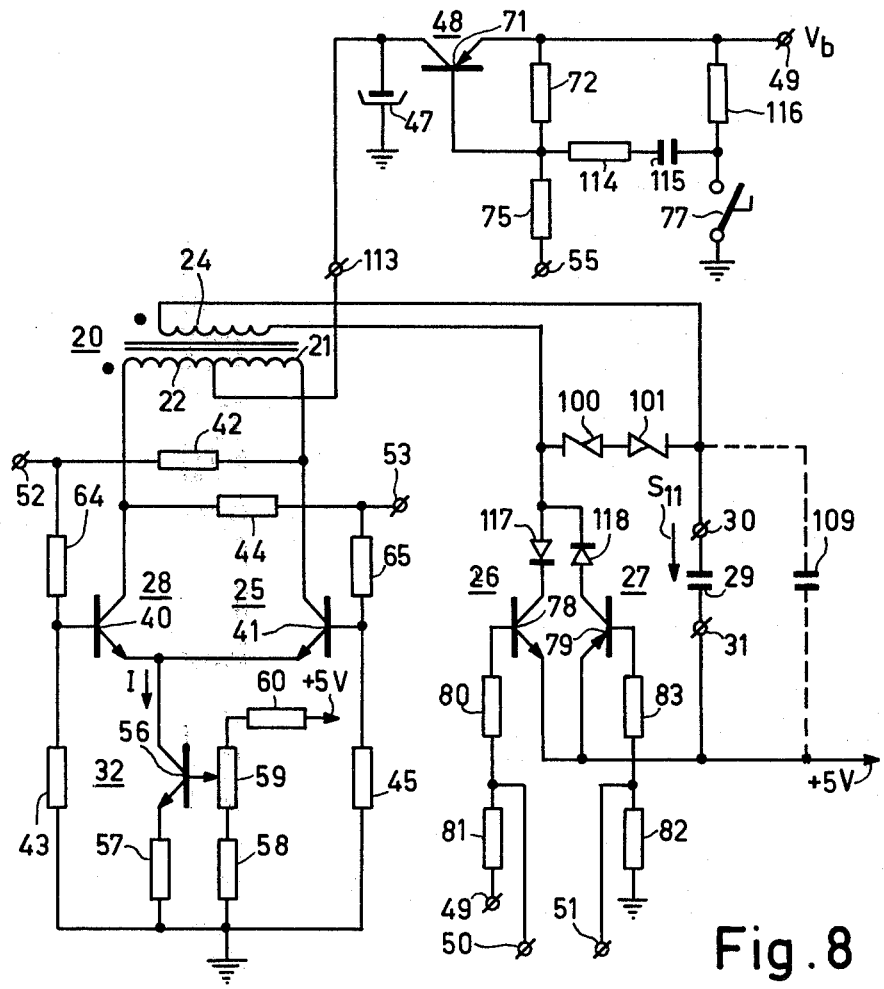
Figure 9:
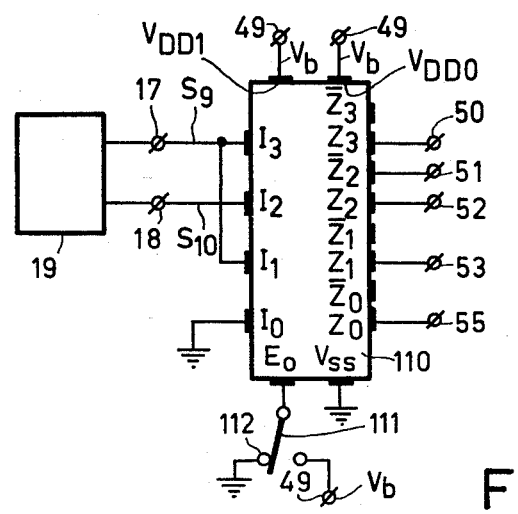

FIG. 5 shows some signal waveforms to illustrate the operation of a device of FIG. 3, FIG. 6 shows the basic arrangement of a device in accordance with the invention for bringing a piezo-electric positioning element into a rest position, FIG. 7 shows a signal waveforms to illustrate the operation of the device of FIG. 6, FIG. 8 shows a practical embodiment of a device in accordance with the invention, FIG. 9 shows an integrated circuit for transferring control signals to the device of FIG. 8.

Figure 1:
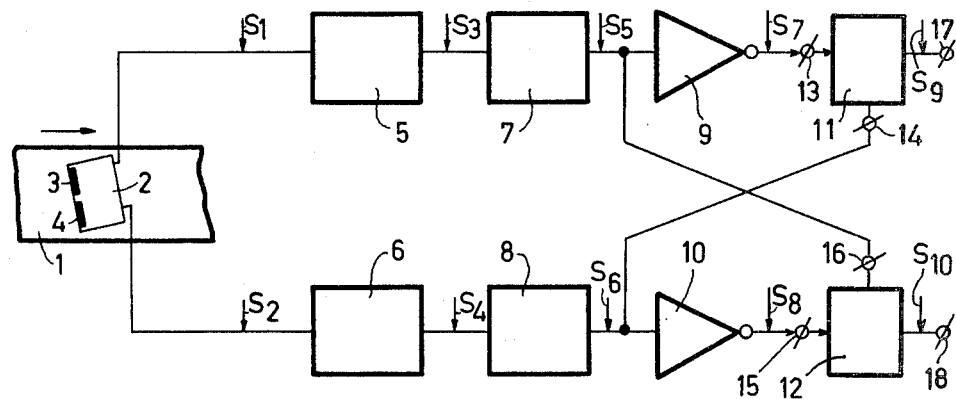
FIG. 1 shows an example of a device for generating pulse-shaped control signals for the device in accordance with the invention.

FIG. 1 shows a device for supplying pulse-shaped signals which are a measure of the phase difference between two signals. This device may be employed in conjunction with a preferred embodiment of an amplifier for controlling a piezo-electric element. In this preferred embodiment this device is used for controlling the position of a read head 2 relative to a signal which has been recorded on a record carrier 1 in the form of a tape ("azimuth control"). If the gap position of a head is not in conformity with the recorded signal, i.e. relative to the tape is not parallel to the gap of the head by means of which the signal has been recorded, the characteristic of the signal transfer from the write head via the tape to the read head is adversely affected.

Figure 2:
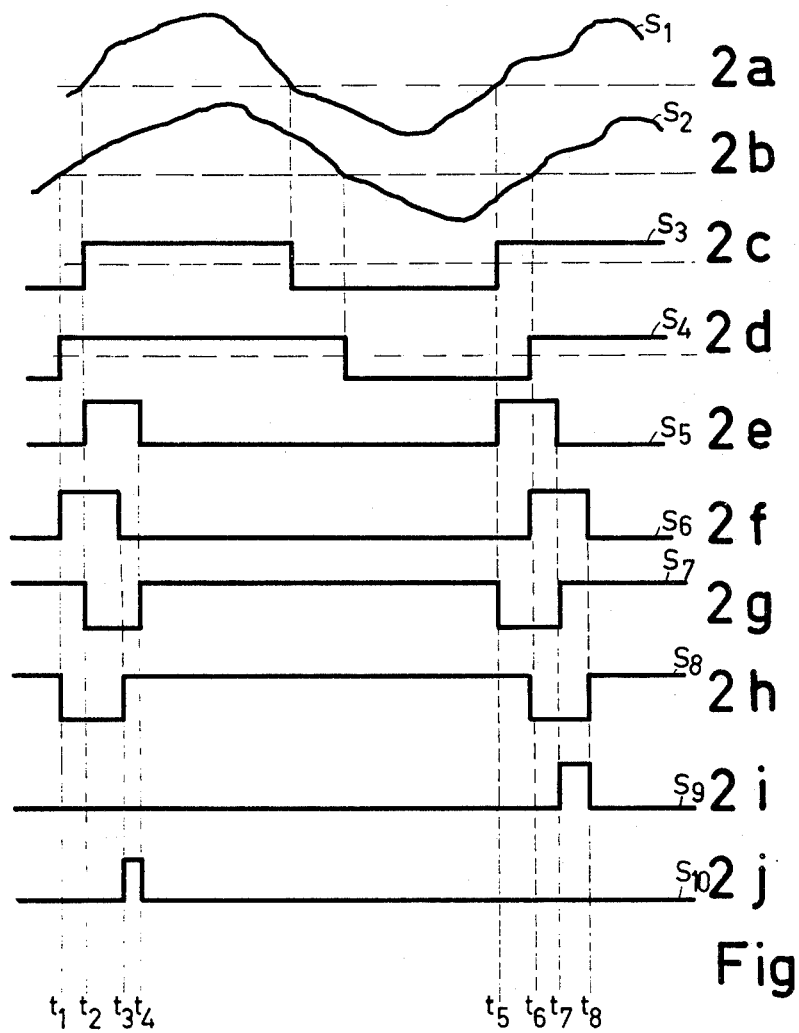
FIG. 2 shows some signal waveforms to illustrate the operation of the circuit of FIG. 1.

In order to enable the position of the read head 2 relative to the signal recorded on the tape 1 to be controlled, the gap of the head 2 has been divided in two sections 3 and 4, each with a separate coil, not shown, supplying a signal $S_1$ and $S_2$ respectively. These signals are shown in FIG. 2a and FIG. 2b, respectively, and in the present example have phase differences of different polarity at the instants $t_1$ and $t_2$. Signals $S_1$ and $S_2$ are applied to a circuit 5 and 6 respectively, which circuits clean the signals $S_1$ and $S_2$, for example in order to reduce the influence of noise, and which supply an output signal $S_3$ and $S_4$ respectively, which signals are square-wave shaped and are in synchronism with the zero passages of the signals $S_1$ and $S_2$ respectively. This squarewave shape can for example be obtained by applying signals $S_1$ and $S_2$ to a limiting amplifier. Signals $S_3$ and $S_4$, which are shown in FIG. 2c and FIG. 2d, respectively are applied to circuits 7 and 8, respectively, which supply pulses $S_5$ and $S_6$ of constant and equal duration in synchronism with the positive-going zero crossings of the signals $S_3$ and $S_4$, i.e. also in synchronism with the positive zero crossing of the signals $S_1$ and $S_2$, respectively. Circuits 7 and 8 may, for example, be monostable multivibrators or, alternatively, counters. FIG. 2e and FIG. 2f show the respective signals $S_5$ and $S_6$. Via inverters 9 and 10 the signals $S_5$ and $S_6$ are respectively inverted. The inverted signals $S_7$ and $S_8$ are shown in FIG. 2g and FIG. 2h, respectively. Signals $S_7$ and $S_8$ are applied to inputs 13 and 15 of a flip-flop 11 and 12, respectively while the signals $S_6$ and $S_5$ are respectively applied to the inputs 14 and 16 of the flip-flop 11 and 12, respectively. The flip-flops 11 and 12 are of a type in which the signals $S_9$ and $S_{10}$ (see FIG. 2i and FIG. 2j respectively) on outputs 17 and 18 respectively are low as the signals $S_6$ and $S_5$ on the respective inputs 14 and 16 are low and which change state upon a rising edge of the signals $S_7$ and $S_8$ on inputs 13 and 15 respectively, provided that the signals $S_6$ and $S_5$ on the respective inputs 14 and 16 are high. The inverters 9 and 10 may be dispensed with if flip-flops are employed which change-over on the negative edges of the signal on inputs 13 and 15. In the example of FIG. 2i the output signal $S_9$ does not change state on the rising edge of the signal $S_7$ at instant $t_4$, because the signal $S_6$ is low at this instant. At instant $t_7$ this signal $S_9$ changes from low to high on the rising edge of the signal $S_7$ at that instant and back from high to low at instant $t_8$ when the signal $S_6$ becomes low again. In this way a pulse having a duration corresponding to the phase difference between the signals $S_1$ and $S_2$ is generated that output 17, which pulse appears only if the signal $S_1$ leads with respect to the phase of the signal $S_2$. In a similar manner such a pulse is generated on output 18, but only if the signal $S_1$ lags the signal $S_2$. The device of FIG. 1 thus generates pulses which are a measure of the phase difference between the signals $S_1$ and $S_2$ and thus of the incorrect position of head 2 relative to the recorded signal. The device in accordance with FIG. 1 is described more generally and in more detail in Patent Application Ser. No. 041,673, filed May 23, 1979.

FIG. 3 shows a device for the conversion of the output signal of the device of FIG. 1 into a voltage across a capacitive element 29, in the present preferred embodiment a piezo-electric element for positioning the head 2.

Figure 4:
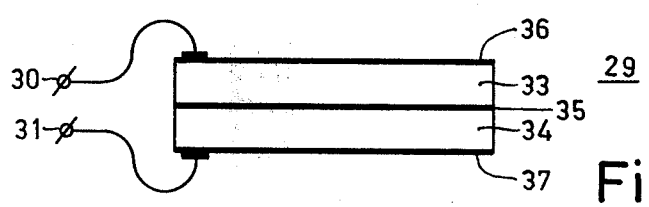
FIG. 4 shows the basic construction of a piezo-electric positioning element.

FIG. 4 shows the construction of an embodiment of such a piezo-element by way of illustration. It comprises two layers of a piezo electric material 33 and 34, which, upon the application of an electric field in opposite directions, vary in length so as to produce a deflection. These layers 33 and 34 are arranged on a common conductive layer 35 and, on the sides facing layer 35, they are provided with electrodes 36 and 37 which are connected to terminals 30 and 31. From an electrical point of view this piezo-element behaves as a capacitance 29 between terminals 30 and 31.

The device of FIG. 3 comprises a transformer 20 having a primary winding consisting of two halves 21 and 22 with a centertap leading to a power supply terminal 23 and a secondary winding 24. The piezo-electric element 29 in series with the two parallel switches 26 and 27 is connected in parallel with the secondary winding 24. One side of the primary winding 21 and 22 is connected to a current source 32 via a switch 25 and the other side via a switch 26. The switches 25 and 26 are actuated by the signal $S_9$ at output 17 of a device 19, for example, such as that shown in FIG. 1, and the switches 27 and 28 by the signal $S_{10}$ on output 18.

In order to illustrate the operation of the device of FIG. 3, FIG. 5a shows an example of the signal $S_9$, FIG. 5b shows an example of the signal $S_{10}$, and FIG. 5c shows the voltage $S_{11}$ produced across the piezo element 29 in response to the signals $S_9$ and $S_{10}$.

At the instant $t_0$ in FIG. 5, a specific voltage $V_o$ appears across the piezo-element 29. If at instant $t_1$ a pulse appears on output 17, switches 25 and 26 are closed and the current I from current source 32 flows to power supply terminal 23. This current is transformed to the secondary 24 and charges the capacitance of the piezo-element 29 via switch 26. If there is a secondary current $I_o$, the value of capacitance 29 is C and the duration of the pulse T, the voltage across the piezo-element increases with a value $dV = I_o T/C$; for example for $T = 10^{-6}$ secs., $I_o = 10$ mA, and $C = 2.5 \ 10^{-9}$ F, $dV = 4$ V.

At instant $t_2$ the pulse in the signal $S_9$ has terminated and switches 25 and 26 open, so that the discharging of the capacitance 29 stops. Upon each further pulse in the signal $S_9$ the voltage $S_{11}$ across capacitance 29 is further increased. If at the instant $t_3$ a pulse appears in the signal $S_{10}$, switches 27 and 28 are closed. The current I then flows via the primary 21 and is tranformed to the secondary 24 and discharges the capacitance 29 via the switch 27 until at instant $t_4$ the pulse in the signal $S_{10}$ ends and switches 27 and 28 open. The capacitance 29 is further discharged by further pulses in the signal $S_{10}$.

The embodiment of FIG. 3 is not the only possibility of supplying the piezo-element 29, which behaves as a capacitance, with a comparatively high control voltage by a pulsating charge supply and drainage without the need for a source of comparatively high supply voltage. As an example, the center tap of the transformer may be dispensed with if for example the current direction in the primary or secondary winding is reversed by commutation depending on whether the pulse appears on the output 17 or 18. It is alternatively possible to supply charging pulses to a capacitance with the aid of a choke and switches or rectifying elements, in such a way that the voltage across the capacitance can far exceed the available supply voltage. Furthermore, a current source is not essential either. It is for example also possible to use a voltage source in series with a load resistor. Furthermore, a single secondary switch may be used instead of two switches 26 and 27, provided that the switches are controlled both by the signal $S_9$ and by the signal $S_{10}$. Furthermore, it is also possible to employ a transformer with a secondary center tap, the piezo-electric element being connected to the tap and to one or the other side of the secondary winding via a switch depending on the control signals.

Situations may occur in which the device 19 supplies no signals, for example in the device of FIG. 1 if head 2 is used as a write head and reproduces no signals. In such a case it may be desirable to cause the piezo-element to assume a rest or reference position, for example by removing the voltage across that element or by the application of a reference voltage across it. However, since for such a piezo-element as the case may be with the inclusion of transport mechanisms, exhibits hysteresis, the rest position at the reference voltage depends on the last energized condition and is consequently not well-defined. A solution to this problem is to cause the voltage across the piezo-element to oscillate symmetrically about the desired reference voltage at a frequency below the resonant frequency of the element and with an amplitude which decreases to zero. This may, for example, be effected by including the piezo-element as capacitance in a resonant circuit which is controlled by a multivibrator energized with a voltage which decreases as a function of time.

FIG. 6 shows the circuit diagram of such a multivibrator. It comprises transistors 40 and 41 with common emitter resistor 46 and crosswise collector-base negative feedback via resistors 42, 43 and 44, 45. The piezo-element 29 is connected between the collector electrodes of the two transistors 40 and 41 and constitutes a resonant circuit together with the self-inductances 38 and 39 in the collector circuits. The collectors of the two transistors are connected to a power supply terminal 49 via the self-inductances 38 and 39 and via a power supply switch 48. A power-supply buffer capacitor 47 is connected in parallel with the multivibrator.

FIG. 7 represents the voltage $S_{11}$ across the piezo-element 29 as a function of time. Initially a voltage $V_o$ appears across the piezo-element. At the instant $t_O$ the multivibrator is started in a manner not shown in FIG. 6, for example, by including the piezo-element in the resonant circuit or by activating the crosswise negative feedback networks. At the same instant the power supply switch 48 is opened. After the instant $t_O$ the piezo-element 29 discharges via the two low resistance self-inductances, so that the average voltage across the piezo-element very rapidly decreases from an initial voltage $V_o$ to a reference voltage $V_r$, which is O V in the example of FIG. 6, so that the oscillation is symmetrical relative to the reference voltage. If the voltage corresponding to the initial voltage $V_O$ Is not discharged rapidly enough, a symmetrical oscillation can nevertheless be obtained by limiting the voltage across the piezo element symmetrically relative to the reference voltage, for example with zener diodes. The amplitude of the oscillating voltage across the piezo-element decreases as a function of time because the multivibrator is energized by the buffer capacitor 47 after the switch 48 has been opened. Ultimately, the voltage across the piezo-element becomes equal to $V_r$ and the piezo-element 29 assumes a defined spatial position corresponding to the voltage $V_r$, any hysteresis effects being eliminated by the oscillation. If there had been no oscillation, the spatial position of the piezo element 29 after discharging of the piezo element to the voltage $V_r$ would depend on the value and polarity of the voltage $V_o$ as a result of hysteresis effects.

The circuit shown in FIG. 6 is not the only possibility of generating an oscillation which decays as a function of time. Instead of a multivibrator numerous oscillating circuits are possible. The amplitude of the oscillation may also be reduced in a different manner, for example by means of a controllable limiter or output amplifier.

FIG. 8 shows a practical embodiment of the basic circuit arrangements in accordance with FIG. 3, which embodiment is such as to enable the principle of FIG. 6 to be applied. The switches 25 and 28 are realised with a transistor 41 and 40 respectively, whose collector leads to respectively the one half 21 and the other half 22 of the primary of the transformer 20, the centre tapping of said primary being connected to the power supply terminal 49 which carries a voltage $V_b$. The emitters of transistors 40 and 41 are connected to the current source 32, which comprises a transistor 56 with an emitter resistor 57, which transistor receives a base reference voltage from a direct voltage source (+5 V)

via a voltage divider comprising the resistors 58, 59 and 60. The bases of transistors 40 and 41 are respectively connected to the control inputs 52 and 53 via a resistor 64 and 65 respectively and to the negative power supply, in the present example earth, via a resistor 43 and 45 respectively.

If the voltage an input 53 is high and that on input 52 is low, transistor 41 conducts the current I from current source 32 to the half 21 of the primary transformer 20 and if the voltage on input 53 is low and that on input 52 is high, transistor 40 feeds said current I to the primary winding half 22. By applying the signal $S_9$ and $S_{10}$ respectively to the control inputs 52 and 53, this part of the circuit of FIG. 8 operates in a similar way as the primary section of the basic arrangement in accordance with FIG. 3.

The secondary winding 24 of transformer 20 is connected to a power supply point (+5 V) both via switches 26 and 27 and via the piezo-element 29. The switches 26 and 27 respectively comprise an npn transistor 78 and a pnp transistor 79, which transistors 78 and 79 are connected to the power supply point (+5 V) with their emitter sides. For protection against inverse operation the collector circuits of the transistors 78 and 79 include diodes 117 and 118. Parallel to the secondary winding the series connection of two zener diodes 100 and 101 is included, with their zener breakdown directions opposed, for protection against excess voltages. The base electrode of transistor 78 and 79 is connected to a control input terminal 50 and 51 respectively via a resistor 80 and 83 respectively. If the voltages on control inputs 50 and 51 are high, transistor 78 transfers the current produced in the secondary 24, and if the voltages on control inputs 50 and 51 are low, transistor 79 transfers current in the opposite direction. If the signal $S_9$ and the inverted signal $S_{10}$ are applied to the control input 50 and 51 respectively, the operation of this secondary section is fully identical to the operation of the secondary section of the circuit arrangement in accordance with FIG. 3.

As the quality of the capacitance of piezo elements is sometimes poor, such elements for example often have a comparatively high leakage resistance, it may be desirable, for example in order to increase the RC time constant, to include a capacitor 109 in parallel with the piezo element 29. This may be a permanent connection as is shown dashed in FIG. 8, but also a connection via switches, so that said capacitor 109 can be included at option.

In order to enable the circuit of FIG. 8 to operate in accordance with the method as described with reference to FIGS. 6 and 7, resistors 42 and 44 are included between inputs 52 and 53 and the collectors of transistor 41 and 40 respectively and resistors 81 and 82 are included between inputs 50 and 51 and power supply terminal 49 and earth respectively.

When inputs 50, 51, 52 and 53 are energized with the signals $S_9$, $\overline{S_{10}}$, and $S_{10}$, the resistors 42, 44, 81 and 82 do not affect the operation of the circuit. However, when these inputs are floating, transistors 78 and 79 are turned on, so that the capacitance of the piezo-electric element 29 can discharge via the transformer and crosswise negative feedback is applied between the base and collector electrodes of the transistors 40 and 41 via the resistors 42 and 44, so that these transistors start to operate as a multivibrator with the transformed capacitance of the piezo-element 29 and the indictances of the transformer 20 as resonant circuit. The circuit then behaves in a similar way as the circuit of FIG. 6. The zener diodes 100 and 101 then limit the amplitude of the oscillation on the secondary side to values which are symmetrical about O V.

In order to cause the amplitude of the oscillation to decrease as a function of the time, as has been described with reference to FIG. 6, a buffer capacitor 47 and a power supply switch 48 are included. Said switch 48 comprises a pnp transistor 71, whose emitter is connected to the positive supply terminal 49 and via a resistor 72 to its base. The base of transistor 71 is furthermore connected to a control input 55 via a resistor 75.

If the voltage on control input 55 is low, transistor 71 is conductive and the primary section of the circuit is energized with the voltage $V_b$, which is then also available across the buffer capacitor 47. If input 55 (at the same time as the inputs 50, 51, 52 and 53) is floating transistor 71 cuts off and the primary section of the circuit is energized from the buffer capacitor 47, so that the amplitude of the oscillation will decrease as a function of time.

In order to enable the oscillation to be restarted, a push-button switch 77 is included between the base of transistor 71 and ground. Brief depression of this switch causes transistor 71 to be turned on briefly, so that the buffer capacitor 47 is charged again. In the embodiment of FIG. 8 a pulse shaper is added to the push-button 77 in order to render the time during which transistor 71 conducts independent of the time that the push-button 77 is depressed. For this purposes an RC network with resistor 114 and capacitor 115 is included between switch 77 and the base of transistor 71 and a resistor 116 between switch 77 and supply terminal 49.

If switch 77 is open and output 55 is floating, the voltage across the capacitor 115 is zero volts. When switch 77 is closed, the base of transistor 71 goes to zero volts and transistor 71 is turned on. Simultaneously capacitor 115 is charged via resistor 114, so that after a time which is determined by the time constant of the RC network 114, 115 transistor 71 is turned off again.

In the present example of a cassette recorder switch 77 may for example be actuated at the same time as the recording switch, so that the piezo-element is brought into its rest position even if no playback has occurred after the apparatus has been switched on.

FIG. 9 shows an example of how signals can be applied to the inputs 50, 51, 52, 53 and 55 of the circuit arrangement in accordance with FIG. 8. Use is made of a logic circuit 110 which transfers the signals on the inputs to low-ohmic outputs with a possibility of rendering said outputs floating (=high ohmic). An example of such a circuit 110 is an integrated circuit which is available from N.V. Philips Gloeilampenfabrieken under typenumber HEF 4104B. The input and output designations of the IC 110 shown in FIG. 9 are in conformity with the description of said IC HEF 4104B in "Philips data handbook, Semiconductors and integrated circuits", Part 6, October 1977.

The operation of the IC 110 is as follows. If the voltage on input $E_0$ is high, the signals on the outputs $Z_0$, $Z_1$, $Z_2$ and $Z_3$ correspond to said signals on inputs $I_0$, $I_1$, $I_2$ and $I_3$ respectively, the outputs $\overline{Z_0}$, $\overline{Z_1}$, $\overline{Z_2}$ and $\overline{Z_3}$ supplying the inverse of the signals on inputs $I_0$, $I_2$, and $I_3$. If the voltage on input $E_0$ is low, the outputs $Z_0$, $Z_1$, $Z_2$, $Z_3$, $\overline{Z_0}$, $\overline{Z_1}$, $\overline{Z_2}$ and $\overline{Z_3}$ are floating.

To ensure that the circuit of FIG. 8 operates as described, the control inputs 50, 51, 52, 53 and 55 are respectively connected to the outputs $Z_3$, $Z_2$, $\overline{Z_2}$, $Z_1$ and $Z_0$. The signal $S_{10}$ is applied to input $I_2$ and the signal $S_9$ to inputs $I_1$ and $I_3$. Input $I_0$ is connected to earth (= "low") and input $E_0$ to a switch 111 which is either connected to earth or to the positive supply voltage $V_b$.

If input $E_0$ is connected to supply voltage $V_b$, the signals on control inputs 50, 51, 52 and 53 respectively correspond to the signals $S_9$, $S_{10}$, $S_{10}$ and $S_9$. The control input 55 is then low, so that the circuit of FIG. 8 operates as described with actuated power supply switch 48.

If switch 111 is changed over, so that input $E_0$ is connected to earth power supply switch 48 is opened and the circuit starts to oscillate with decreasing amplitude.

The circuit of FIGS. 8 and 9 is realised with the following components:

| | |
|---|---|
| 110 | HEF 4104 B |
| 40, 41, 56 | BD 335 |
| 78, 103 | BF 442 |
| 79, 104 | BF 423 |
| 71 | BD 262 |
| 100, 101 | BZX 610120 |
| 117, 118 | BY 206 |
| 47 | 150 microfarads |
| 109 | 0, 15 microfarads |
| 115 | 4.7 microfarads |
| 43, 45 | 6800 Ohms |
| 64, 65, 80, 83 | 4700 Ohms |
| 42, 44, 81, 82 | |
| 105, 108, 114, 116 | |
| 57 | 10,000 Ohms |
| 58 | 4.7 Ohms |
| 60 | 1000 Ohms |
| 72, 106, 107 | 2200 Ohms |
| 75 | 47,000 Ohms |
| 59 | 22,000 Ohms |
| | potentiometer 2200 Ohms |
| transformer 20 | primary 2 × 180 turns |
| | secondary 5400 turns |
| $V_b$ | 10–15 V. |

What is claimed is:

1. A device for controlling a piezo-electric positioning element, in particular for positioning a recording and/or reproducing element relative to an information track, said device comprising means for generating an oscillating electrical signal having an amplitude which varies symmetrically about a reference value and decreases to said reference value as a function of time and means for applying said oscillating signal to the piezo-electric element to cause said element to vibrate with a decreasing amplitude and assume a well defined reference configuration upon decrease of said amplitude of said oscillating signal to said reference value, said generating means comprising a resonant circuit including the piezo-electric element which acts as a capacitance in said resonance circuit, a transformer having a primary winding with a center tap and a secondary winding, first switching means for connecting the piezo-electric element in parallel with said secondary winding, first means for closing said first switching means prior to the beginning of said oscillating signal, first coupling means for connecting said tap to one terminal of a power supply, a first transistor having a collector connected to one end of said primary winding, a second transistor having a collector connected to the other end of said primary winding, second coupling means for connecting the emitters of said first and second transistors to a second terminal of the power supply, the base electrode of said first transistor being connected to the collector of said second transistor in a degenerative sense and the base electrode of said second transistor being connected to the collector of said first transistor in a degenerative sense, and second means for starting electrical oscillations in said resonant circuit to produce said oscillating signal.

2. A device as claimed in claim 1 wherein the base electrodes of the first and second transistor are connected to a first and a second control input, respectively, said first and second means are constituted by a second circuit having outputs which are connected to the first and the second control input, said second circuit being switchable between a first state in which the outputs have a comparatively low output impedance and transfer control voltages to the base electrodes of the first and the second transistor, and a second state in which said outputs have a comparatively high output impedance and are consequently floating, so that cross-wire negative feedback becomes active between the bases and collectors of the frist and second transistor producing electrical oscillations.

3. A device as claimed in claim 2, wherein the first means comprises a switch, which is included in one of said first and second coupling means, and a buffer capacitor connected between the side of said switch which is remote from the associated power supply terminal and the other coupling means, said switch being open during the generation of said oscillating signal.

4. A device as claimed in claim 3 wherein said switch comprises a third transistor whose collector is connected to the buffer capacitor, whose emitter is connected to the supply terminal associated with said switch, and whose base is connected to the emitter via an impedance and to an output of the second circuit, which output has a voltage in the first state such that said transistor is conductive.

5. A device as claimed in claim 2, 3 or 4 wherein the first switching means comprises a fourth transistor of a first conductivity type and a fifth transistor of a second conductivity type, the emitters of said fourth and fifth transistor being connected to a point at a fixed voltage and the collector-emitter paths being connected in parallel with the series connection of the secondary winding and the piezo-electric element, the base electrodes of the fourth and the fifth transistor being connected to outputs of the second circuit and, via impedances, to points at a voltage such that when the outputs of said second circuit are in the second state the fourth and the fifth transistor are conductive.

6. A device as claimed in claim 4 comprising a switch having one side connected to the base of the third transistor via an RC network and to the emitter of said third transistor via a resistor and the other side connected to a point of fixed voltage, in such a way that when said switch is closed the third transistor becomes conductive for a specific time.

7. In an apparatus for controlling a piezo-electric positioning element used for moving a second element such a recording and/or playback element or the like coupled to said piezo-electric element to and or from a predetermined position corresponding to a configuration assumed by the piezo-electric element upon application thereto of a reference voltage, the improvement comprising means for generating an oscillating voltage having an amplitude which is initially higher than said varies symmetrically about the reference voltage and which decreases to the reference voltage as a function of time, and means for applying said oscillating voltage to the piezo-electric element so as to cause the piezo-electric element to oscillate with a decreasing amplitude and assume said given configuration corresponding to said predetermined position when the amplitude of said oscillating voltage decreases to said reference voltage thereby substantially eliminating hystersis effects so that the second element returns to the predetermined position after displacement therefrom.

8. The apparatus according to claim 7 wherein the frequency of oscillation of said oscillating voltage is below the resonant frequency of the piezo-electric element.

9. An apparatus according to claim 7 wherein said generating means comprises a resonant circuit, said circuit including the piezo-electric element, and means for supplying to said circuit a voltage of a magnitude which decreases as a function of time.

10. An apparatus according to claim 9 wherein said circuit includes a transformer having a primary and a secondary winding, switching means for connecting the piezo-electric element across said secondary winding and means for activating said switching means.

* * * * *